United States Patent
Dishongh et al.

(10) Patent No.: US 6,461,891 B1
(45) Date of Patent: *Oct. 8, 2002

(54) METHOD OF CONSTRUCTING AN ELECTRONIC ASSEMBLY HAVING AN INDIUM THERMAL COUPLE AND AN ELECTRONIC ASSEMBLY HAVING AN INDIUM THERMAL COUPLE

(75) Inventors: Terrance J. Dishongh, Hillsboro; Paul W. Churilla; David H. Pullen, both of Portland, all of OR (US)

(73) Assignee: Intel Corporation, Santa Clara, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/394,860

(22) Filed: Sep. 13, 1999

(51) Int. Cl.[7] ............... H01L 21/44; H01L 21/50
(52) U.S. Cl. ............... 438/106; 438/108; 438/109; 438/117; 438/122; 438/613
(58) Field of Search .................. 438/108, 109, 438/106, 118, 117, 127, 111, 112, 110, 612, 613, 15, 122; 257/703

(56) References Cited

U.S. PATENT DOCUMENTS

| | | | |
|---|---|---|---|
| 4,034,469 A | | 7/1977 | Koopman et al. ............ 29/628 |
| 4,323,914 A | | 4/1982 | Berndlmaier et al. ......... 357/82 |
| 4,545,840 A | * | 10/1985 | Newman et al. ............ 156/276 |
| 5,325,265 A | | 6/1994 | Turlik et al. ................ 361/702 |
| 5,396,403 A | | 3/1995 | Patel .......................... 361/705 |
| 5,728,606 A | * | 3/1998 | Laine et al. ................ 438/122 |
| 5,783,465 A | * | 7/1998 | Canning et al. ............ 438/119 |
| 5,837,562 A | * | 11/1998 | Cho .............................. 438/51 |
| 5,863,814 A | * | 1/1999 | Alcoe et al. ................ 438/117 |
| 5,904,495 A | * | 5/1999 | Burke et al. .................. 438/98 |
| 5,923,086 A | | 7/1999 | Winer et al. ................ 257/713 |
| 5,930,597 A | * | 7/1999 | Call et al. .................... 438/106 |
| 5,930,599 A | * | 7/1999 | Fujimoto et al. ........... 438/113 |
| 5,937,279 A | * | 8/1999 | Sawada et al. ............. 438/123 |
| 5,940,687 A | * | 8/1999 | Davis et al. ................. 438/118 |
| 5,950,072 A | * | 9/1999 | Queyssac .................... 438/118 |
| 5,969,415 A | * | 10/1999 | Prancz ......................... 257/679 |
| 6,022,759 A | * | 2/2000 | Seki et al. ................... 438/123 |
| 6,025,213 A | * | 2/2000 | Nemoto et al. ............. 438/122 |
| 6,046,071 A | * | 4/2000 | Sawai et al. ................ 438/106 |
| 6,046,077 A | * | 4/2000 | Baba .......................... 438/127 |
| 6,063,647 A | * | 5/2000 | Chen et al. ................. 438/108 |
| 6,063,649 A | * | 5/2000 | Yoshino ..................... 438/118 |
| 6,069,025 A | * | 5/2000 | Kim ........................... 438/109 |
| 6,071,757 A | * | 6/2000 | Fogal et al. ................ 438/110 |
| 6,074,898 A | * | 6/2000 | Ohsawa et al. ............. 438/123 |
| 6,121,070 A | * | 9/2000 | Akram ....................... 438/108 |
| 6,130,116 A | * | 10/2000 | Smith et al. ................ 438/127 |

(List continued on next page.)

FOREIGN PATENT DOCUMENTS

WO    PCT/US 00 23778    8/2000

*Primary Examiner*—Matthew Smith
*Assistant Examiner*—Chuong Luu
(74) *Attorney, Agent, or Firm*—Blakely, Sokoloff, Taylor & Zafman LLP

(57) ABSTRACT

According to one aspect of the invention a method of constructing an electronic assembly is provided. The electronic assembly is constructed from a semiconductor package including a package substrate and a semiconductor chip mounted to the package substrate, a thermally conductive member, and a substance including indium. The method comprises securing the thermally conductive member and the semiconductor package in a selected orientation relative to one another with the thermally conductive member on a side of the semiconductor chip opposing the package substrate and with the substance located between the semiconductor chip and at least a portion of the thermally conductive member. The substance is thermally coupled to the semiconductor chip on one side and thermally coupled to the portion of the thermally conductive member on an opposing side.

25 Claims, 3 Drawing Sheets

U.S. PATENT DOCUMENTS

| | | | |
|---|---|---|---|
| 6,140,144 A | * 10/2000 | Najafi et al. | 438/53 |
| 6,184,066 B1 | * 2/2001 | Chino et al. | 438/118 |
| 6,200,828 B1 | * 3/2001 | Jeng et al. | 438/106 |
| 6,204,091 B1 | * 3/2001 | Smith et al. | 438/108 |
| 6,207,467 B1 | * 3/2001 | Vaiyapuri et al. | 438/15 |
| 6,214,649 B1 | * 4/2001 | Ishida | 438/126 |
| 6,258,626 B1 | * 7/2001 | Wang et al. | 438/107 |
| 6,261,870 B1 | * 7/2001 | Haehn et al. | 438/124 |
| 6,265,244 B1 | * 7/2001 | Hayashi et al. | 438/106 |
| 6,326,239 B1 | * 12/2001 | Asai et al. | 438/112 |

* cited by examiner

US 6,461,891 B1

METHOD OF CONSTRUCTING AN ELECTRONIC ASSEMBLY HAVING AN INDIUM THERMAL COUPLE AND AN ELECTRONIC ASSEMBLY HAVING AN INDIUM THERMAL COUPLE

BACKGROUND OF THE INVENTION

1). Field of the Invention

This invention relates to a method of constructing an electronic assembly and to an electronic assembly which may be made according to the method of the invention.

2). Discussion of Related Art

Integrated circuits are formed on semiconductor wafers. The wafers are then sawed into semiconductor chips. Each semiconductor chip is then mounted to a package substrate. An integrated circuit within the semiconductor chip can be powered up and data signals can be sent to and received from the integrated circuit via the package substrate.

When the integrated circuit is powered up, heat is generated on the semiconductor chip which could cause destruction of the integrated circuit if the heat is not transferred away. A thermally conductive plate is often located next to the semiconductor chip. A thermally conductive grease may be located between the semiconductor chip and the thermally conductive plate. The thermally conductive grease contacts the semiconductor chip and the thermally conductive plate on opposing sides and acts as a thermal couple between the semiconductor chip and the thermally conductive plate. Heat can then be transferred from the semiconductor chip through the grease to the thermally conductive plate, from where heat can be transferred to a heat sink or other device and be convected into the ambient.

The use of a grease as a thermal couple is often unsuitable for high power applications. A thermally conductive grease does not transfer a sufficient amount of heat when a large amount of heat is generated on a semiconductor chip. One reason why a thermally conductive grease is not a good conductor of heat is because there are no metals in a thermally conductive grease. Metals, on the other hand, are usually also electrically conductive. The use of a metal as a thermal couple is therefore usually avoided because an electrically conductive metal may cause shorting between components of the semiconductor chip or the package substrate.

SUMMARY OF THE INVENTION

According to one aspect of the invention a method of constructing an electronic assembly is provided. The electronic assembly is constructed from a semiconductor package including a package substrate and a semiconductor chip mounted to the package substrate, a thermally conductive member, and a substance including indium. The method comprises securing the thermally conductive member and the semiconductor package in a selected orientation relative to one another with the thermally conductive member on a side of the semiconductor chip opposing the package substrate and with the substance located between the semiconductor chip and at least a portion of the thermally conductive member. The substance is thermally coupled to the semiconductor chip on one side and thermally coupled to the portion of the thermally conductive member on an opposing side.

BRIEF DESCRIPTION OF THE DRAWINGS

The invention is further described by way of example with reference to the accompanying drawings wherein.

DETAILED DESCRIPTION OF THE INVENTION

FIG. 1 to FIG. 11 of the accompanying drawings illustrate a method of constructing an electronic assembly. An indium containing alloy is located within a recess within a lid. The indium containing alloy is then heated which causes undesirable voids to form therein due to reaction between the alloy and the material of the lid. The voids are massaged out by heating the alloy and directing a jet of air onto the alloy. A sheet of indium, having a higher melting temperature than the alloy, is used to prevent splattering of the alloy when the jet of air impinges thereon. The cap and the alloy are then assembled together with a semiconductor package in an electronic assembly. The alloy, primarily because of the use of indium, has good thermal conductivity. The alloy is an electric insulator which ensures that components of the semiconductor package are electrically isolated from one another. The alloy does not break through into the material of a package substrate of the semiconductor package. The alloy also has a relatively low melting temperature which makes it possible to melt the alloy without causing destruction of an integrated circuit in a semiconductor chip of the semiconductor package. Regardless thereof that the alloy causes voids when being heated, the voids are massaged away from a heat conducting portion of the alloy.

Figure 1:
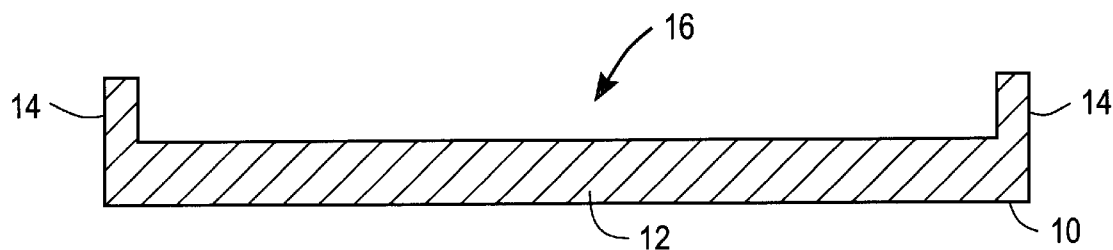
FIG. 1 is a sectioned side view of a lid which is used in constructing an electronic assembly according to an embodiment of the invention.

FIG. 1 of the accompanying drawings illustrates a thermally conductive lid 10 which is used in constructing an electronic assembly according to the invention. The lid 10 may be made of a material such as copper having good thermal conductivity. The lid 10 includes a central portion 12 and four sidewalls 14. A recess 16 is defined above the central portion 12 within the sidewalls 14.

Figure 2:
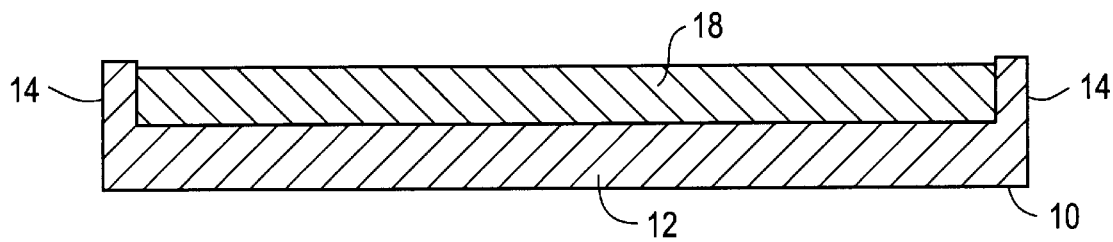
FIG. 2 is a sectioned side view of the lid after a first sheet of a first alloy is inserted into a recess of the lid.

The lid 10 is cleaned and then, as shown in FIG. 2, a first sheet 18 of a first alloy is inserted into the recess 16. The first sheet 18 is sized to fit between the sidewalls 14 and almost fills the recess 16. The first alloy preferably includes mass ratios of 44.7% bismuth, 22.6% lead, 19.1% indium, 8.3% tin, and 5.3% cadmium. A sheet of an alloy of this kind can be obtained from Indium Corporation of America in Utica, N.Y. The choice and characteristics of such an alloy will be evident from the description that follows.

Figure 3:
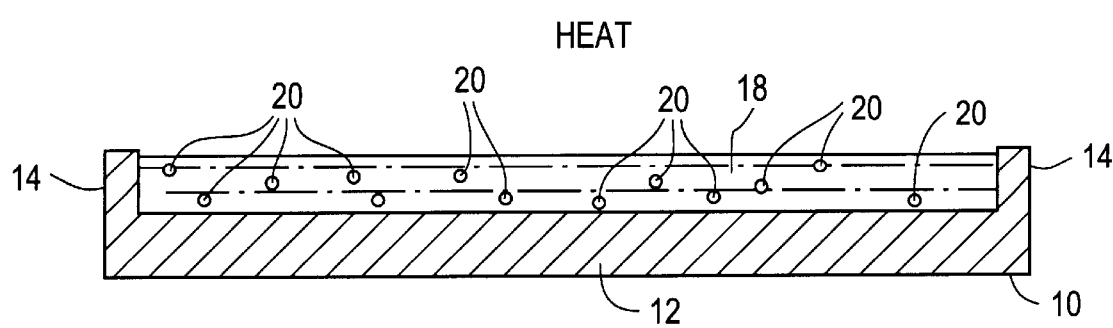
FIG. 3 is a sectioned side view after the first sheet is heated to cause melting of the first alloy.

The lid 10 and the first sheet 18 are then heated to above the melting temperature of about 115° C. of the first alloy to cause melting of the first alloy 18 as shown in FIG. 3. The indium in the first alloy 18 reacts with the copper of the lid 10 to cause bubbles or voids 20 within the first alloy 18. Voids within the first alloy 18 are undesirable for heat conduction purposes. The number of voids 20 are however much fewer than when pure indium is used instead of the alloy 18.

Figure 4:
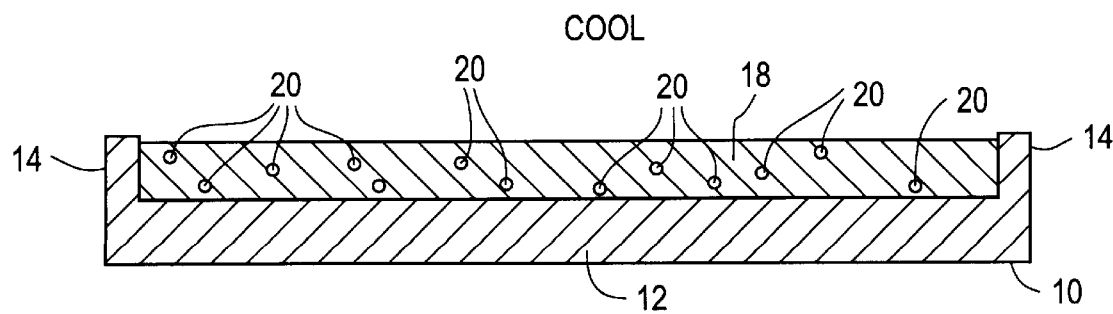
FIG. 4 is a sectioned side view of the lid after the first alloy is solidified.
Figure 5:
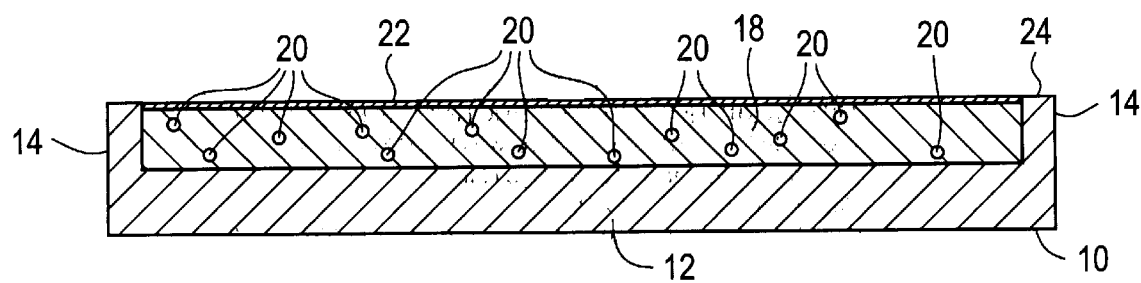
FIG. 5 is a sectioned side view of the lid, further showing a second sheet that is located within the recess.

The first alloy 18 is then allowed to cool to cause solidification thereof as shown in FIG. 4. The voids 20 are then trapped within the solidified first alloy 18. As shown in FIG. 5, a second sheet 22 is then located on top of the second alloy 18. The second sheet 22 is typically about 2 mm thick and is preferably made of pure indium. The second sheet 22 is located up to a rim 24 of the lid 10.

Figure 6:
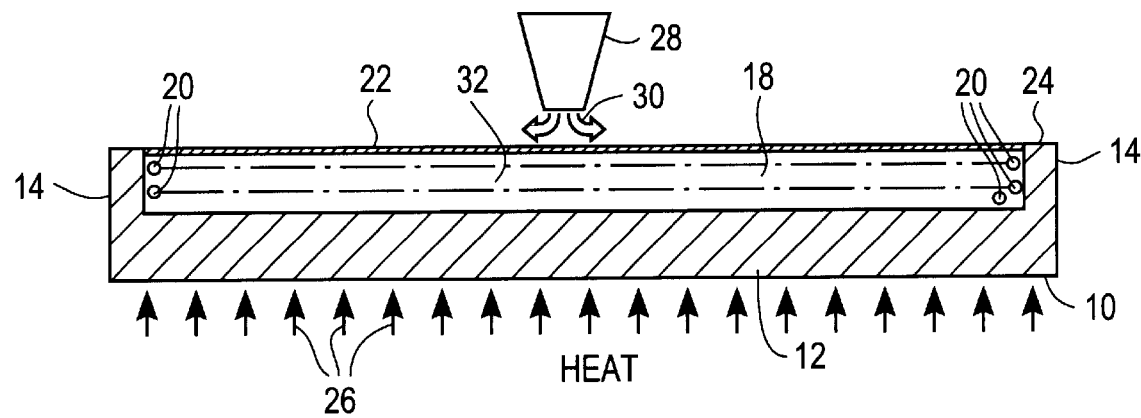
FIG. 6 is a sectioned side view illustrating how the combination of FIG. 5 is heated and how voids in the first alloy are massaged out.

As shown in FIG. 6, infrared radiation 26 is then used to heat the lid 10 from below. Heat is transferred from the lid 10 to the first alloy 18. The combination of the lid 10, the first alloy, and the second sheet 22 is heated to a temperature which is above the melting temperature of 115° C. of the first alloy 18. The substantially pure indium of the second sheet 22 has a melting point of about 135° C. The combination of the cap 10, the first alloy 18, and the second sheet 22 is heated to a temperature which is below the 135° C. melting point of the second sheet 22. The first alloy 18 is thereby melted but the second sheet 22 remains solid. The lower melting point of the first alloy 18, when compared to the substantially pure indium of the second sheet 22, is primarily due to the inclusion of the lead within the first alloy 18. The lead is preferably present between 0.5% and 30% by mass.

Figure 7:
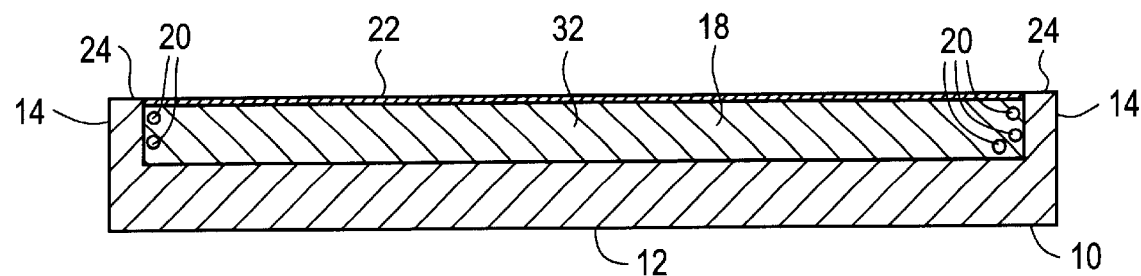
FIG. 7 is a sectioned side view of the lid, the first alloy, and the first sheet after being cooled.

A nozzle 28 is used to direct a jet of air 30 onto a central portion of the second sheet 22. The jet of air 30 impinges at substantially right angles onto the second sheet 22 and spreads from a central portion of the second sheet 22 outwardly. Because of deflection of the jet of air 30, a force is created on the second sheet 22 from where the force transferred to the first alloy 18. The force created by the air massages the voids 20 outwardly away from a central portion 32 of the first alloy 18. Most of the voids 20 escape from between an interface between the rim 24 and an edge of the second sheet 22. Some voids 20 may still remain in outer portions of the first alloy 18. The central portion 32 of the first alloy 18 is however substantially or completely free of voids. The first alloy 18 is then allowed to cool to cause solidification thereof as shown in FIG. 7. Some voids 20 may be located in outer regions of the solidified first alloy 18. The second sheet 22 is located on the solidified second alloy 18.

Figure 8:
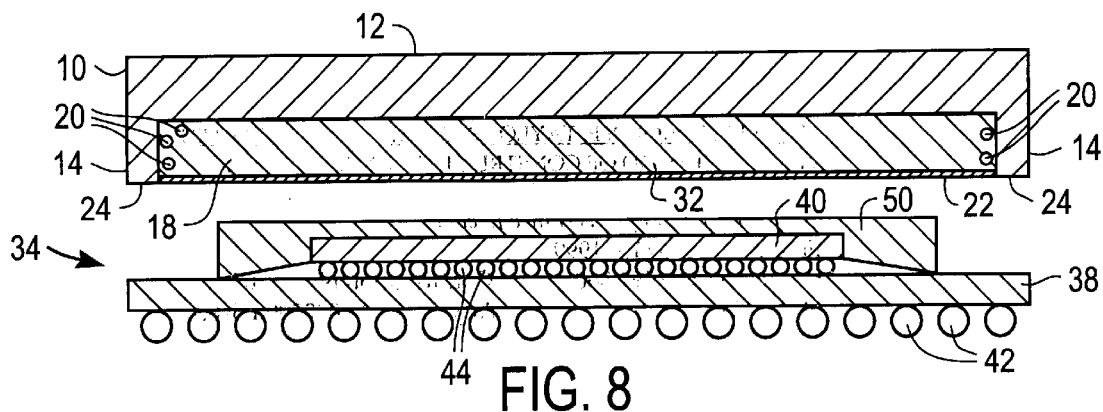
FIG. 8 is a sectioned side view of components of an electronic assembly including the lid, the first alloy, the second sheet, and further including a semiconductor package having a package substrate and a semiconductor chip, and further including a third sheet of a second alloy.

FIG. 8 illustrates the cap 10, including the first alloy 18 and the second sheet 22 which is inverted, and a semiconductor package 34 which is also used for constructing an electronic assembly according to an embodiment of the invention. The semiconductor package includes a package substrate 38 and a semiconductor chip 40.

The package substrate 38 is at least partially made of an dielectric material. The dielectric material may for example be a resin such as bismateinite triazine resin which forms a surface thereof. An array of solder balls in the form of a ball grid array 42 is located on a lower surface of the package substrate 38.

The semiconductor chip 40 is typically made of a semiconductor material such as silicon and has an integrated circuit (not shown) formed therein. An array of solder bumps 44 are formed on an upper surface of the semiconductor chip 40 containing the integrated circuit and the semiconductor chip 40 is then flipped as shown in FIG. 8 so that the solder bumps 44 are at the bottom according to a process commonly referred to as "controlled collapse chip connect" (C4). The semiconductor chip 40 is located on an upper surface of the package substrate 38 with the solder bumps 44 located between the package substrate 38 and the semiconductor chip 40. The semiconductor package 34 is then heated and allowed to cool, thereby causing attachment of the other bumps 44 to the package substrate 38.

A third sheet 50 of a second alloy is located over the semiconductor chip 40. The composition of the second alloy of the third sheet 50 may be the same as the composition of the first alloy 18.

Figure 9:
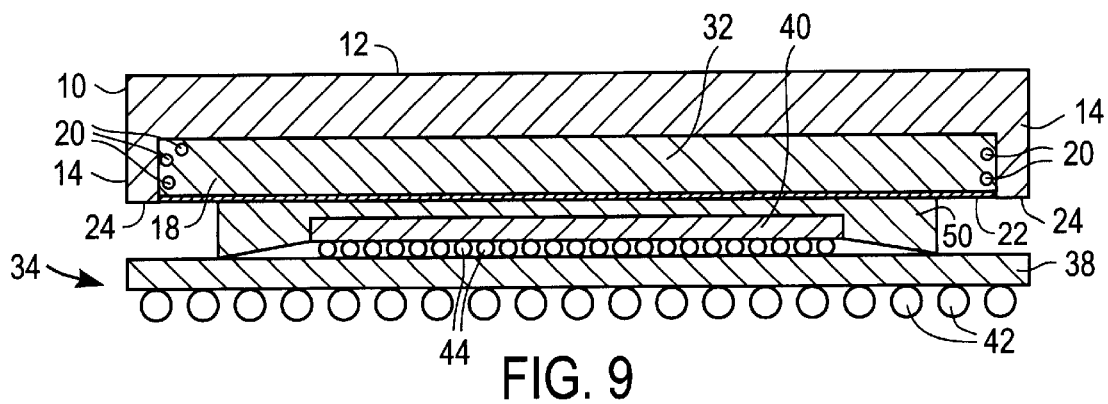
FIG. 9 is a sectioned side view of the components of FIG. 8 after the second sheet is located on the third sheet.

As shown in FIG. 9, a lower surface of the second sheet 22 is then brought into contact with an upper surface of the third sheet 50 so that the combination of the second sheet 22, the first alloy 18, and the lid 10 rests on the third sheet 50.

Figure 10:
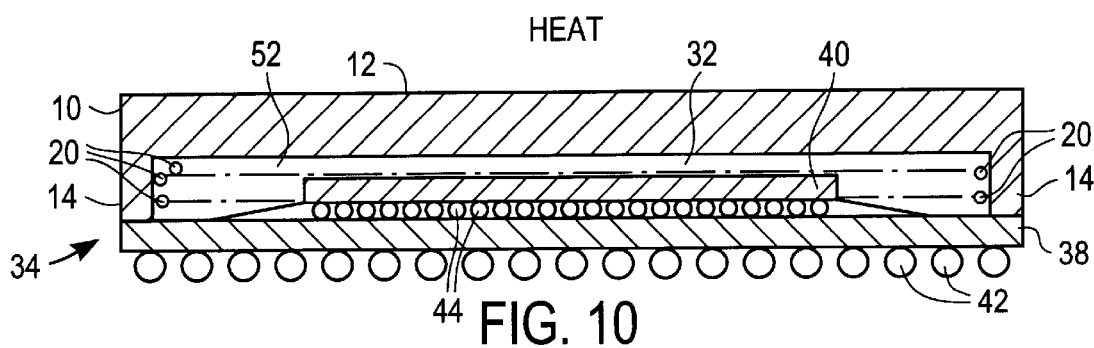
FIG. 10 is a sectioned side view of the components of FIG. 9 after the first alloy, the second sheet, and the third sheet are heated to cause melting thereof into a mixture.

The combination shown in FIG. 9 is then heated to a temperature above 135° C. The first and second alloys 18 and 50 and the second sheet 22 melt at a temperature above 135° C. The combination shown in FIG. 9 is never heated to a temperature above 150° C., so as to avoid destruction of an integrated circuit in the semiconductor chip 40. When the first and second alloys 18 and 50 and the second sheet 22 melt, the lid 10 drops onto the package substrate 38 is shown in FIG. 10. The melted material of the third sheet 50 acts as a wetting layer to ensure proper thermal coupling onto an upper surface of the semiconductor chip 40. A melted mixture 52 of the first and second alloys 18 and 50 and the indium of the second sheet 26 fill an entire area between the semiconductor chip 40 and the central portion 12 of the lid 10. The melted mixture 52 is therefore in contact with an upper surface of the semiconductor chip 40 and a lower surface of the central portion 12 of the lid 10.

Because of the choice of the materials of the melted mixture 52, the mixture 52 does not break into the dielectric material of the package substrate 38 as may happen if another metal is used instead of the mixture 52.

Figure 11:
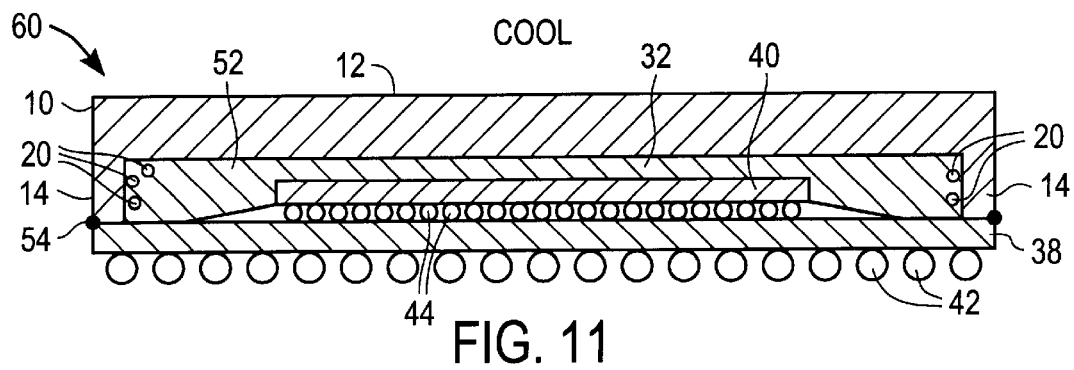
FIG. 11 is a sectioned side view of the components of FIG. 10 after cool down and solidification of the mixture.

The combination as shown in FIG. 10 is then allowed to cool to cause solidification of the mixture 54 as shown in FIG. 11. An epoxy bead 54 is then located within a filleted interface between the lid 10 and the package substrate 38. The epoxy bead 52 secures the lid 10 to the package substrate 38, thereby finalizing construction of an electronic assembly 60.

The mixture 52 provides an efficient thermal coupling between the semiconductor chip 40 and the lid 10, primarily because of the use of a metal in the form of indium in the mixture 52. The indium in the mixture 52 is preferably at least 1% by mass to provide an efficient thermal couple, although a higher percentage such as at least 10% is a much better thermal conductor. The mixture, including the indium, is an electric insulator, so that components of the semiconductor package 34, for example the solder bumps 44 or electric traces on the package substrate 38, are electrically isolated from one another even if the mixture 52 contacts these components. It should be noted that a central portion 32, through which heat is conducted from the semiconductor chip 40 to the lid 10, is substantially free of voids, as such ensuring that there is an efficient heat conduction path between the semiconductor chip 40 and the lid 10.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

We claim:

1. A method of constructing an electronic assembly, the method comprising:
   locating a thermally conductive member, a thermally conductive indium-containing substance, and semiconductor package, including a package substrate and a semiconductor chip, having an integrated circuit formed thereon, mounted to the package substrate, in a selected orientation relative to one another so that at least a portion of the thermally conductive member is located on a side of the semiconductor chip opposing the package substrate and the substance is located between the semiconductor chip and the portion of the thermally conductive member;
   heating the substance while the thermally conductive member, the substance and the semiconductor package are in the selected orientation relative to one another, the substance being heated to a temperature above its melting point so that the substance melts; and
   cooling the substance to below its melting point so that the substance solidifies, whereafter the substance provides a thermally conductive thermal couple between the semiconductor chip and the portion of the thermally conductive member.

2. A method according to claim 1, wherein the substance contacts the semiconductor chip on one side of the substance.

3. A method according to claim 2, wherein the substance contacts the portion of the member on an opposing side of the substance.

4. A method according to claim 1, wherein the substance contacts two parts of the semiconductor package without causing a short between the two parts.

5. A method according to claim 1, wherein the substance has a melting point below 150° C. and is heated to above its melting point but below a temperature which causes destruction of the integrated circuit.

6. A method according to claim 1, wherein the member is a lid having a recess and the substance is a first sheet of material that is located in the recess, the method further comprising:
   heating the first sheet in the recess to cause it to melt.

7. A method according to claim 6, wherein the lid is of a thermally conductive material that reacts with the alloy when the alloy is heated to cause it to melt, reaction between the alloy and the material of the lid resulting in voids within the alloy, the method further comprising:
   removing at least some of the voids from a portion of the substance, the portion of the substance being located between the semiconductor chip and the portion of the lid when the lid and the semiconductor package are located in the selected orientation.

8. A method according to claim 7, wherein the alloy when reacting with the material of the lid causes fewer voids than voids created by pure indium when reacting with the material of the lid.

9. A method according to claim 7, wherein the thermally conductive material of the lid is copper.

10. A method according to claim 7, wherein the voids are massaged out of the portion of the substance.

11. A method according to claim 10, wherein the voids are massaged out by a jet of fluid that creates a force which moves the voids out of the portion of the substance.

12. A method according to claim 11, further comprising:
    locating a second sheet of material over the substance; and
    heating the substance to a temperature above its melting point to cause melting of the substance but below the melting point of the second sheet of material so that the second sheet of material remains intact while the substance is melted, the jet of fluid impinging on the second sheet and the second sheet preventing splattering of the melted substance by the jet of fluid.

13. A method according to claim 12, wherein the material of the second sheet includes indium.

14. A method according to claim 12, further comprising:
    cooling the substance after the voids are massaged out, the substance being cooled to a temperature below its melting point;
    locating the substance next to the semiconductor chip; and
    heating the substance to above its melting point to cause reflow of the substance over the semiconductor chip.

15. A method according to claim 14, further comprising:
    locating a third sheet, which includes indium, over the semiconductor chip, the third sheet and the substance being simultaneously heated to above their melting points, the third sheet acting as a wetting layer for ensuring proper thermal coupling to the semiconductor chip.

16. A method of constructing an electronic assembly from:
    (i) a semiconductor package including a package substrate and a semiconductor chip, having an integrated circuit formed thereon, mounted to the package substrate;
    (ii) a lid of a thermally conductive material, the lid having a recess; and
    (iii) a first sheet of a first alloy, the method comprising:
       locating the first sheet in the recess;
       heating the first sheet to above its melting point to cause softening of the first alloy, the first alloy reacting with the material of the lid to cause voids within the first alloy;
       locating a second sheet of material on the first alloy, the second sheet of material including indium and having a higher melting point than the first alloy;
       directing a jet of fluid onto the second sheet while the second sheet and the first alloy are at a temperature between the melting point of the first alloy and the melting point of the second sheet, the second sheet preventing splattering of the first alloy by the jet of fluid, the jet of fluid massaging the voids out of at least a portion of the first alloy;
       locating the lid and the semiconductor package in a selected orientation wherein the semiconductor chip is next to the recess; and
       heating the second sheet and the first alloy to a temperature above the melting point of the second sheet to cause reflow of the second sheet and the first alloy over the semiconductor chip, the material of the second sheet and the first alloy providing a thermal couple between the lid and the semiconductor chip, with the portion of the first alloy located between the semiconductor chip and the lid.

17. The method of claim 16 wherein the alloy includes indium.

18. A method of constructing an electronic assembly, comprising:

inserting a first alloy including indium into a recess of a thermally conductive lid;

heating the first alloy in the recess to cause it to melt wherein the lid is of a thermally conductive material that reacts with the first alloy when the alloy is heated to cause it to melt, reaction between the alloy and the material of the lid resulting in voids within the alloy;

removing at least some of the voids from a portion of the substance; and locating the first alloy adjacent to a semiconductor chip, having an integrated circuit formed therein, mounted to a package substrate, the portion of the substance being located between the semiconductor chip and the lid.

19. A method according to claim 18, wherein the alloy when reacting with the material of the lid causes fewer voids than voids created by pure indium when reacting with the material of the lid.

20. A method according to claim 18, wherein the thermally conductive material of the lid is copper.

21. A method according to claim 18, wherein the voids are massaged out of the portion of the substance.

22. A method according to claim 18, wherein the voids are massaged out by a jet of fluid that creates a force which moves the voids out of the portion of the substance.

23. A method according to claim 18, further comprising:

locating a second sheet of material over the substance; and heating the substance to a temperature above its melting point to cause melting of the substance but below the melting point of the second sheet of material so that the second sheet of material remains intact while the substance is melted, the jet of fluid impinging on the second sheet and the second sheet preventing splattering of the melted substance by the jet of fluid.

24. A method according to claim 18, wherein the material of the second sheet includes indium.

25. A method according to claim 18, further comprising:

cooling the substance after the voids are massaged out, the substance being cooled to a temperature below its melting point;

locating the substance next to the semiconductor chip; and heating the substance to above its melting point to cause reflow of the substance over the semiconductor chip.

* * * * *